(12) United States Patent
Ma

(10) Patent No.: US 11,971,636 B2
(45) Date of Patent: Apr. 30, 2024

(54) DISPLAY PANEL, MANUFACTURING METHOD THEREOF, AND DISPLAY DEVICE

(71) Applicant: Wuhan China Star Optoelectronics Technology Co., Ltd., Hubei (CN)

(72) Inventor: Rong Ma, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 944 days.

(21) Appl. No.: 16/966,029

(22) PCT Filed: Apr. 3, 2020

(86) PCT No.: PCT/CN2020/083236
§ 371 (c)(1),
(2) Date: Jul. 30, 2020

(87) PCT Pub. No.: WO2021/114523
PCT Pub. Date: Jun. 17, 2021

(65) Prior Publication Data
US 2023/0176432 A1 Jun. 8, 2023

(30) Foreign Application Priority Data
Dec. 12, 2019 (CN) .......................... 201911277068.3

(51) Int. Cl.
G02F 1/1362 (2006.01)
G02F 1/1339 (2006.01)
G02F 1/1345 (2006.01)

(52) U.S. Cl.
CPC .... *G02F 1/136286* (2013.01); *G02F 1/13452* (2013.01); *G02F 1/1339* (2013.01); *G02F 1/136222* (2021.01); *G02F 2201/50* (2013.01)

(58) Field of Classification Search
CPC ........... G02F 1/136286; G02F 1/13452; G02F 1/1339; G02F 1/136222; G02F 2201/50; G02F 1/133; G02F 1/1333; H01L 27/124
See application file for complete search history.

(56) References Cited

U.S. PATENT DOCUMENTS

| 2017/0148702 A1* | 5/2017 | Funayama | ............ G06F 3/0445 |
| 2017/0261799 A1* | 9/2017 | Lee | ...................... H01L 23/4985 |
| 2018/0217434 A1* | 8/2018 | Kawata | .................. G02F 1/1339 |

(Continued)

FOREIGN PATENT DOCUMENTS

| CN | 102466901 | 5/2012 |
| CN | 208384310 | 1/2019 |
| CN | 109671352 | 4/2019 |

(Continued)

*Primary Examiner* — Changhyun Yi

(57) ABSTRACT

The present invention provides a display panel, a manufacturing method thereof, and a display device. The display panel includes power line layer. The power line layer includes a first power line layer and a second power line layer, and the second power line layer is electrically connected to the first power line layer. The first power line layer extends toward a first side surface of the substrate and is bent along the first side surface to a side of the substrate away from the second power line layer. A first circuit board is disposed on a side of the substrate away from the second power line layer, and the first circuit board is electrically connected to the first power line layer.

4 Claims, 5 Drawing Sheets

(56) References Cited

U.S. PATENT DOCUMENTS

2020/0066821 A1* 2/2020 Saitoh .................... H05B 33/10

FOREIGN PATENT DOCUMENTS

| CN | 110297346 | 10/2019 |
|----|-----------|---------|
| CN | 110308579 | 10/2019 |
| CN | 110928004 | 3/2020 |
| JP | 2014-021478 | 2/2014 |

* cited by examiner

DISPLAY PANEL, MANUFACTURING METHOD THEREOF, AND DISPLAY DEVICE

RELATED APPLICATIONS

This application is a National Phase of PCT Patent Application No. PCT/CN2020/083236 having International filing date of Apr. 3, 2020, which claims the benefit of priority of Chinese Patent Application No. 201911277068.3 filed on Dec. 12, 2019. The contents of the above applications are all incorporated by reference as if fully set forth herein in their entirety.

FIELD AND BACKGROUND OF THE INVENTION

The present application relates to the display field, and more particularly to a display panel, a manufacturing method thereof, and a display device.

With advance of social technology and improvements of people's life quality, liquid crystal displays (LCD) with narrow bezels and full screens are increasingly sought after by people.

In the prior art, narrow-bezel LCDs mainly reduce upper and lower bezels by compressing a sealing frame to a display area, but because the lower bezel needs to be bound with components, such as controllers, it cannot be reduced. Full screens with extremely narrow bezels cannot be achieved, and user experience is thus affected.

Therefore, there is an urgent need for a display panel and a manufacturing method thereof to solve the above technical problems.

SUMMARY OF THE INVENTION

The present application provides a display panel, a manufacturing method thereof, and a display device, to solve the technical problems that components such as a controller need to be bound at a lower bezel of the display panel, which is related to that full screens with extremely narrow bezels cannot be realized.

A display panel comprises:
a substrate;
a power line layer disposed on the substrate, wherein the power line layer comprises a first power line layer and a second power line layer, the second power line layer is electrically connected to the first power line layer, the first power line layer extends toward a first side surface of the substrate and is bent along the first side surface to a side of the substrate away from the second power line layer; and
a first circuit board disposed on a side of the substrate away from the second power line layer, wherein the first circuit board is electrically connected to the first power line layer.

In the display panel of the present application, the first power line layer comprises a first flexible layer close to one side of the substrate, and a plurality of first-type power lines disposed on the first flexible layer line,
wherein the first-type power lines respectively comprises a curved portion on the first side, a first portion close to the second power line layer, and a second portion close to the first circuit board, and the first portion is electrically connected to a terminal on the second power line layer are, and the second portion is electrically connected to the first circuit board.

In the display panel of the present application, the first flexible layer is disposed away from the second power line layer; and
the first-type power lines are bonded on the second power cord layer.

In the display panel of the present application, the first flexible layer and the second power line layer have a first overlapping portion;
wherein the first overlapping portion comprises the second power line layer in contact with the first flexible layer and the first flexible layer disposed on the second power line layer; or
wherein the first overlapping portion comprises the first flexible layer in contact with the second power line layer and the second power line layer disposed on the first flexible layer.

In the display panel of the present application, wherein the display panel further comprises a first protection layer on the first power line layer;
the first protection layer comprises a first end close to the second power line layer and a second end close to the first circuit board; and
the first end of the first protection layer is located on the first portion of the first-type power lines, and the second end of the first protection layer is located on the second portion of the first-type power line.

In the display panel of the present application, wherein the first end of the first protection layer covers the first portion of the first-type power lines to overlap the second power line layer.

In the display panel of the present application, a horizontal distance between a terminal area of the second power line layer and the first side surface is 300 to 500 microns.

In the display panel of the present application, wherein the display panel comprises a display area and a non-display area located at a periphery of the display area; and
horizontal distances between any two first borders of the display area and a second borders of the display panel corresponding thereto are the same.

A manufacturing method of a display panel, comprising:
forming a first power line layer and a second power line layer on a same layer on the substrate;
forming a color filter layer on the first power line layer and the second power line layer;
removing the color filter layer and the substrate corresponding to an area to be cut in the first power line layer;
bending the first power line layer along a first side surface of the substrate to a side of the substrate away from the second power line layer; and
forming a first circuit board electrically connected to the first power line layer on the side of the substrate away from the second power line layer.

In the manufacturing method of a display panel of the present application, wherein:
the step of forming the first power line layer and the second power line layer comprising:
forming a plurality of second-type power lines in a second area on the substrate to form the second power line layer;
forming a first flexible layer on the substrate not covered by the second area;
forming a plurality of first-type power lines electrically connected to the second-type power lines on the first flexible layer to form the first power line comprising the first flexible layer and the first-type power lines Layer; or the step of forming the first power line layer and the second power line layer comprises:
  forming a plurality of second-type power lines in the second area on the substrate to form the second power line layer;
  forming a first flexible layer on the substrate, wherein the first flexible layer bonds on the second-type power supply lines;
  forming a plurality of first-type power lines electrically connected to the second-type power lines on the first flexible layer to form the first power line layer comprising the first flexible layer and the first-type power lines; or
the step of forming the first power line layer and the second power line layer comprises:
  forming a first flexible layer on the first area on the substrate;
  forming a plurality of second-type power lines on the substrate, wherein the plurality of second-type power lines bonds on the first flexible layer to form a second power line layer;
  forming a plurality of first-type power lines bond on the second-type power lines and electrically connected to the second-type power lines on the first flexible layer to form the first type power line layer comprising the first flexible layer and the first power lines.

In the manufacturing method of a display panel of the present application, after the step of forming the first power line layer and the second power line layer, the method further comprises:
  forming a protection layer on the first-type power lines; and
  forming a sealing layer on the first power line layer and the second power line layer.

In the manufacturing method of a display panel of the present application, the display panel comprises a display area and a non-display area located at the periphery of the display area; and
  horizontal distances between any two first borders of the display area and a second borders of the display panel corresponding thereto are the same.

The present application also provides a display device, wherein the display device comprises a display panel; wherein the display panel comprises:
  a substrate;
  a power line layer disposed on the substrate, wherein the power line layer comprises a first power line layer and a second power line layer, the second power line layer is electrically connected to the first power line layer, the first power line layer extends toward a first side surface of the substrate and is bent along the first side surface to a side of the substrate away from the second power line layer; and
  a first circuit board disposed on a side of the substrate away from the second power line layer, wherein the first circuit board is electrically connected to the first power line layer.

In the display device of the present application, wherein the first power line layer comprises a first flexible layer close to one side of the substrate, and a plurality of first-type power lines disposed on the first flexible layer line,
  wherein the first-type power lines respectively comprises a curved portion on the first side, a first portion close to the second power line layer, and a second portion close to the first circuit board, and the first portion is electrically connected to a terminal on the second power line layer are, and the second portion is electrically connected to the first circuit board.

In the display device of the present application, wherein:
  the first flexible layer is disposed away from the second power line layer; and
  the first-type power lines are bonded on the second power cord layer.

In the display device of the present application, wherein the first flexible layer and the second power line layer have a first overlapping portion;
  wherein the first overlapping portion comprises the second power line layer in contact with the first flexible layer and the first flexible layer disposed on the second power line layer; or
  wherein the first overlapping portion comprises the first flexible layer in contact with the second power line layer and the second power line layer disposed on the first flexible layer.

In the display device of the present application, wherein the display panel further comprises a first protection layer on the first power line layer;
  the first protection layer comprises a first end close to the second power line layer and a second end close to the first circuit board; and
  the first end of the first protection layer is located on the first portion of the first-type power lines, and the second end of the first protection layer is located on the second portion of the first-type power line.

In the display device of the present application, wherein the first end of the first protection layer covers the first portion of the first-type power lines to overlap the second power line layer.

In the display device of the present application, wherein a horizontal distance between a terminal area of the second power line layer and the first side surface is 300 to 500 microns.

In the display device of the present application, wherein the display panel comprises a display area and a non-display area located at a periphery of the display area; and
  horizontal distances between any two first borders of the display area and a second borders of the display panel corresponding thereto are the same.

In the present application, a first power line layer electrically connected to a second power line layer is bent to backplate of a substrate to bound components such as controllers to the first power line layer of the backplate to achieve an extremely narrow lower bezel and increase a screen ratio of a screen, and enhance users' visual experience.

DESCRIPTION OF SPECIFIC EMBODIMENTS OF THE INVENTION

Figure 1:
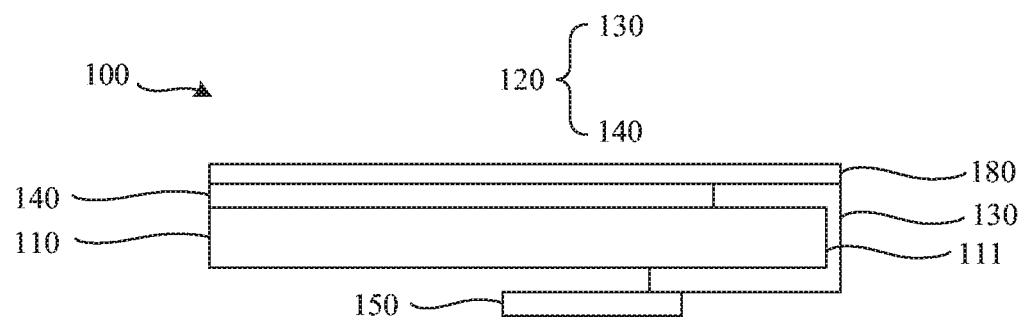
FIG. 1 is a first structural diagram of a display panel of the present application.
Figure 2:
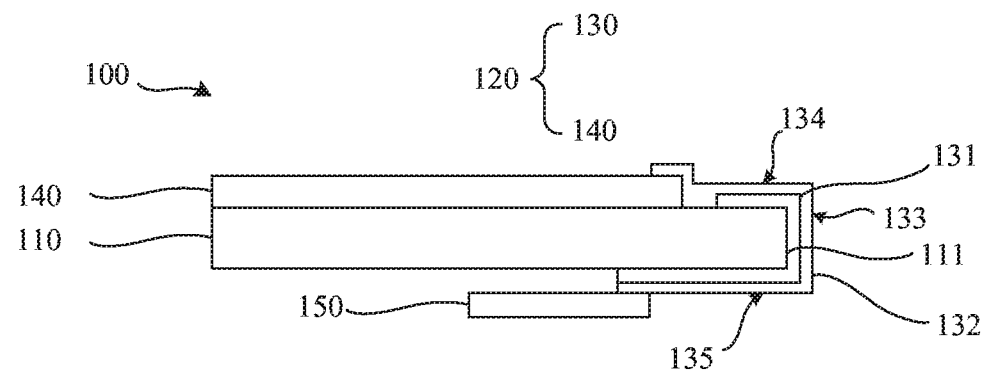
FIG. 2 is a second structural diagram of a display panel of the present application.
Figure 3:
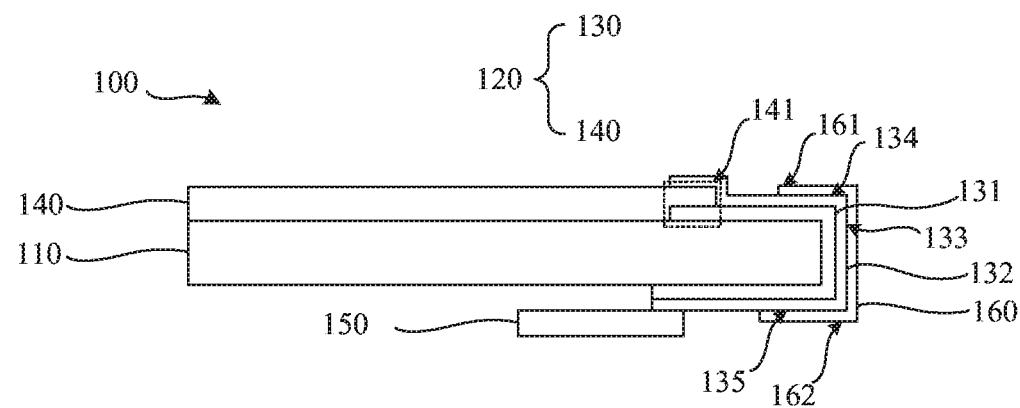
FIG. 3 is a third structural diagram of a display panel of the present application.

In order to make the purpose, technical solution, and effects of the present application clear and unambiguous, the present application will be described in further detail below with reference to the accompanying drawings and examples. It should be understood that the specific embodiments described herein are only used to explain the present application, but are not used to limit the present application.

In the prior art, a narrow-bezel liquid crystal display (LCD) mainly reduces the upper, left, and right bezels by compressing an area from a sealing frame to a display area, but because the lower bezel needs to be bound with components such as controllers so that it cannot be reduced. Thus, an extremely narrow bezel full screen cannot be achieved and users' experience is affected. Based on this technical problem, this application proposes a display panel and a manufacturing method thereof.

Please refer to FIG. 1 to FIG. 7, the present application provides a display panel 100, and the display panel 100 comprises:

a substrate 110;

a power line layer 120 disposed on the substrate 110, wherein the power line layer comprises a first power line layer 130 and a second power line layer 140, and the second power line layer 140 is electrically connected to the first power line layer 130, and the first power line layer 130 extends toward a first side surface 111 of the substrate 110 and is bent along the first side surface 111 to a side of the substrate 110 away from the second power line layer 140; and a first circuit board 150 disposed on a side of the substrate 110 away from the second power line layer 140, wherein the first circuit board 150 is electrically connected to the first power line layer 130.

In the present application, the first power line layer electrically connected to the second power line layer is bent to a backplate of the substrate, and a controller and other components are bound to the first power line layer of the backplate to achieve an extremely narrow lower bezel, thereby increasing a screen ratio of a screen and enhance users' visual experiences.

Technical solutions of the present application will now be described as follows with preferred embodiments.

Embodiment 1

Please refer to FIG. 1 to FIG. 4, the display panel 100 comprises a substrate 110, a power line layer 120 disposed on the substrate 110, and a first circuit board 150 disposed on a side of the substrate 110 away from the second power line layer 140.

The power line layer comprises a first power line layer 130 and a second power line layer 140, and the second power line layer 140 is electrically connected to the first power line layer 130. The first power line layer 130 extends toward a first side surface 111 of the substrate 110 and is bent along the first side surface 111 to a side of the substrate 110 away from the second power line layer 140. The first circuit board 150 is electrically connected to the first power line layer 130. Please refer to FIG. 1 for further details.

In this embodiment, the first side surface 111 of the substrate 110 is a side surface of the display panel 100 away from a center of the substrate 110.

In this embodiment, the first circuit board 150 comprises a flip-chip film, a printed circuit board, or a combination of both the flip-chip film and the printed circuit board.

In this embodiment, the first side surface 111 can be a side surface of the display panel 100 comprising fan-out traces, and the first power line layer 130 extends toward the first side surface 111 and is bent along the first side surface 111 to a side of the substrate 110 away from the second power line layer 140, please refer to FIG. 1 for further details. These fan-out traces can be bent to a backplate of the substrate 110 in a better way to reduce a horizontal distance between the first side surface 111 and a bezel of the display panel 100 corresponding to the first side 111 for achieving a narrow bezel effect.

In this embodiment, the substrate 110 is rigid and has poor bending ability, so that the first power line layer 130 is bent to the backplate of the substrate to reduce the horizontal distance between the first side surface 111 and the bezel of the display panel 100 corresponding to the first side surface 111 for achieving narrow bezel effects.

In this embodiment, the first power line layer 130 comprises a first flexible layer 131 close to a side of the substrate 110 and a plurality of first-type power lines 132 disposed on the first flexible layer 131. The first-type power lines 132 comprise a curved portion 133 on the first side surface 111, a first portion 134 close to the second power line layer 140, and a second portion 135 close to the first circuit board 150. The first portion 134 is electrically connected to terminals on the second power line layer 140, and the second portion 135 is electrically connected to the first circuit board 150, please refer to FIG. 2 for further details.

In this embodiment, the first-type power line 132 can be a fan-out trace or a metal line used for circuit conduction and signal transmission.

In this embodiment, the second power line layer comprises a plurality of second-type power lines, and the second-type power lines can be signal lines, scanning lines, and metal lines of an array substrate used for circuit conduction and signals transmission.

In this embodiment, the substrate 110 can be an array substrate or a substrate.

In this embodiment, the substrate 110 and the power line layer 120 may form an array substrate.

In this embodiment, the first flexible layer 131 comprises polyimide.

In this embodiment, the first flexible layer 131 is disposed away from the second power line layer 140. The first-type power line 132 is bonded on the second power line layer 140, please refer to FIG. 2 for further details. The first flexible layer 131 and the second power line layer 140 have a certain distance therebetween, so that the first type power line 132 and the second power line layer 140 are fully electrically connected, which improves the electrical connection stability therebetween.

In this embodiment, the first flexible layer 131 and the second power line layer 140 have a first overlapping portion 141. The first overlapping portion 141 comprises the second power line layer 140 in contact with the first flexible layer 131 and the first flexible layer 131 on the second power line layer 140, please refer to FIG. 4 for further details. Alternatively, the first overlapping portion 141 comprises the first flexible layer 131 in contact with the second power line layer 140 and the second power line layer 140 on the first flexible layer 131, please refer to FIG. 3 for further details.

The first flexible layer 131 and the second power line layer 140 have a first overlapping portion 141, which can fixedly connect the first flexible layer 131 and the second power line layer 140 in a better way. The first type power cord 132 is electrically connected to the second power line layer 140 to provide stable and fixing electrically connection of the loading layers.

In this embodiment, by electrically connecting the first power line layer and the second power line layer, the first power line layer is bent to a side of the substrate away from the second power line layer, thereby reducing the bezel of the display panel, increasing a screen ratio of a screen, and improving users' visual experiences.

Embodiment 2

Please refer to FIG. 1 to FIG. 4, this embodiment is the same as or similar to the embodiment 1, except for:

The display panel 100 further comprises a first protection layer 160 on the first power line layer 130.

In this embodiment, the first protection layer 160 comprises a first end 161 close to the second power line layer 140 and a second end 162 close to the first circuit board 150. The first end 161 of the first protection layer 160 is disposed on the first portion 134 of the first type power line 132, and the second end 162 of the first protection layer 160 is disposed on the second portion 135 of the first-type power line 132, please refer to FIG. 3 for further details. The first protection layer 160 mainly plays a role of isolating moisture and oxygen from the bending portion 133 of the first-type power line 132 located on the first side 111 to ensure that the first power line layer 130 can work normally.

Figure 4:
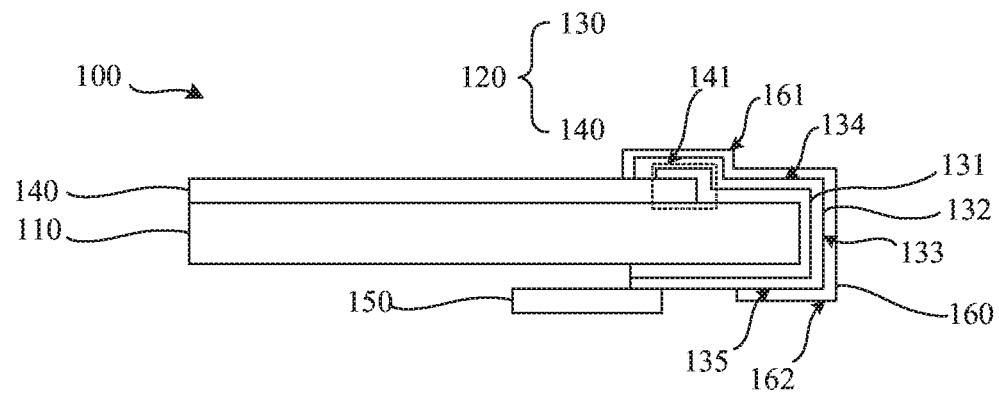
FIG. 4 is a fourth structural diagram of a display panel of the present application.

In this embodiment, the first end 161 of the first protection layer 160 covers the first portion 134 of the first-type power line 132, and is bonded on the second power line layer 140, please refer to FIG. 4 for further details. The first protection layer 160 is bonded on the second power line layer 140 to better protect the first power line layer 130 from moisture, oxygen, etc., and ensure that the first power line layer 130 can work normally.

In this embodiment, the first protection layer 160 is made of a flexible material.

In this embodiment, the display panel 100 further comprises a sealing layer on the power line layer 120, please refer to FIG. 1 for further details. The sealing layer may play a role for isolating moisture and oxygen from the second power line layer and the first portion 133 of the first power line layer 130 to ensure normal operation of the power line layer 120.

In this embodiment, the material of the sealing layer may comprise a flexible material or a rigid material, which is not limited herein.

In this embodiment, the display panel 100 further comprises a color filter layer 180 on the sealing layer. Please refer to FIG. 1 for further details. The color filter layer 180 is provided corresponding to a display area of the display panel 100.

In this embodiment, by providing a protection layer on the first power line layer, isolation of moisture and oxygen from the first power line layer in the bending portion are guaranteed, and normal operation of the display panel is ensured, and the bezel of the display panel is reduced.

Embodiment 3

Please refer to FIGS. 1-7. This embodiment is the same as or similar to Embodiment 1 and Embodiment 2, except for:

The horizontal distance between a terminal area 142 of the second power line layer 140 and the first side surface 111 is defined as D.

Figure 5:
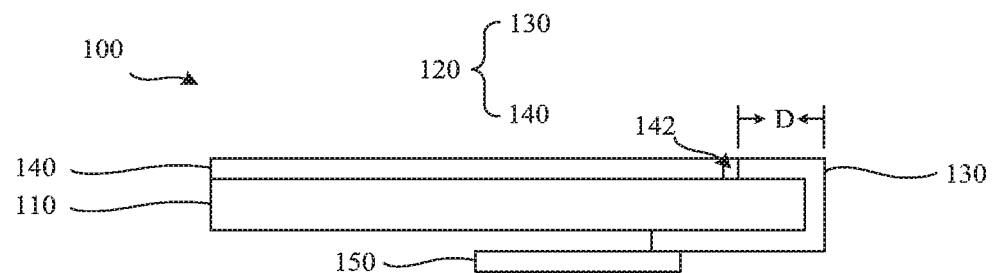
FIG. 5 is a fifth structural diagram of a display panel of the present application.

In this embodiment, the horizontal distance D between the terminal area 142 of the second power line layer 140 and the first side surface 111 is 300 µm to 500 µm, please refer to FIG. 5 for further details. There is a gap between the terminal area 142 of the second power line layer 140 and the first side surface 111, and the first power line layer 130 can be better arranged so that the first-type power line 132 of the first power line layer 130 is electrically connected to the terminal area 142 of the second power line layer 140.

In this embodiment, the horizontal distance D between the terminal area 142 of the second power line layer 140 and the first side surface 111 is 300 µm, please refer to FIG. 5 for further details. A narrower bezel of the display panel can be achieved.

In this embodiment, the horizontal distance D between the terminal area 142 of the second power line layer 140 and the first side surface 111 is 500 µm, please refer to FIG. 5 for further details. Since the bezel of the display panel is wider, the first type power line 132 of the first power line layer 130 and the terminal area 142 of the second power line layer 140 are more firmly electrically connected.

In this embodiment, the horizontal distance D between the terminal area 142 of the second power line layer 140 and the first side surface 111 is 400 µm. Please refer to FIG. 5 for further details. This not only ensures a narrow bezel of the display panel, but also ensures a stable electrical connection between the first type power line 132 of the first power line layer 130 and the terminal area 142 of the second power line layer 140.

In this embodiment, the horizontal distance D between the terminal area 142 of the second power line layer 140 and the first side surface 111 is less than 100 µm, please refer to FIG. 5 for further detail. By shortening the horizontal distance, an extremely narrow bezel of the display panel is realized.

Figure 6:
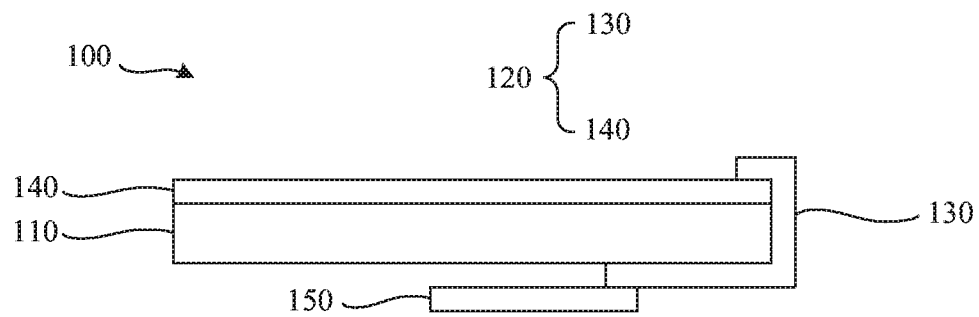
FIG. 6 is a sixth structural diagram of a display panel of the present application.
Figure 7:
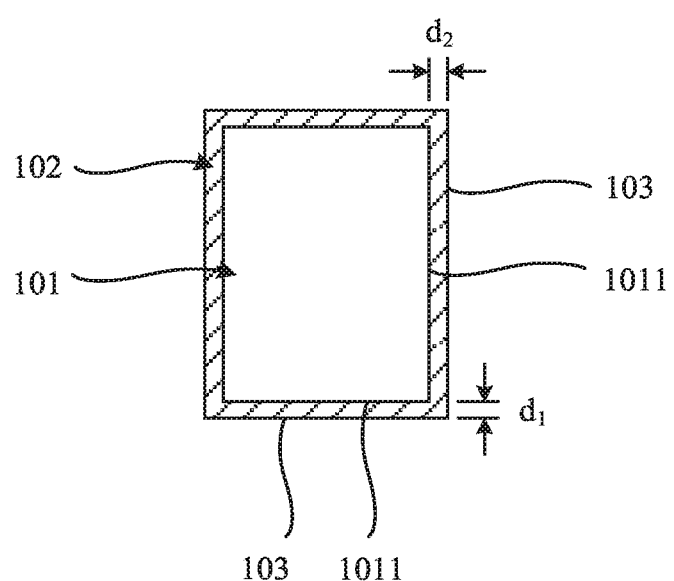
FIG. 7 is a top structural view of a display panel of the present application.

In this embodiment, the horizontal distance D between the terminal area 142 of the second power line layer 140 and the first side surface 111 is 0, please refer to FIG. 6 for further details. By shortening the horizontal distance to zero, an extremely narrow bezel of the display panel is realized.

In this embodiment, the display panel 100 comprises a display area 101 and a non-display area 102 located around the display area 101. Horizontal distances d1 between any two first borders 1011 of the display area 101 and a second border 103 of the display panel 100 corresponding thereto are the same. One of the horizontal distances d1 is equal to the length of the other horizontal distance d2, please refer to FIG. 7 for further details. Four narrow bezels at the upper, lower, left, and right of the display panel are realized and lengths of the bezel gaps at the upper, lower, left, and right of the display panel are equal.

In this embodiment, by setting the length of the substrate between the second power line layer and the first side surface, effects of shortening a size of bezels of the display panel is balanced and stable electrical connection between the two power line layers are realized to realize the display panel with narrow bezels and improve user' experience.

Embodiment 1 to Embodiment 3 realize normal display effects of the display surface, greatly reducing bezels of the display panel, increasing a screen ratio of the display panel, and improving the users' visual experience through bending the first power line layer electrically connected to the second power line layer to a side of the substrate away from the second power line layer and connecting the first power line layer and the substrate away from the first circuit board on one side of the second power line layer.

Figure 8:
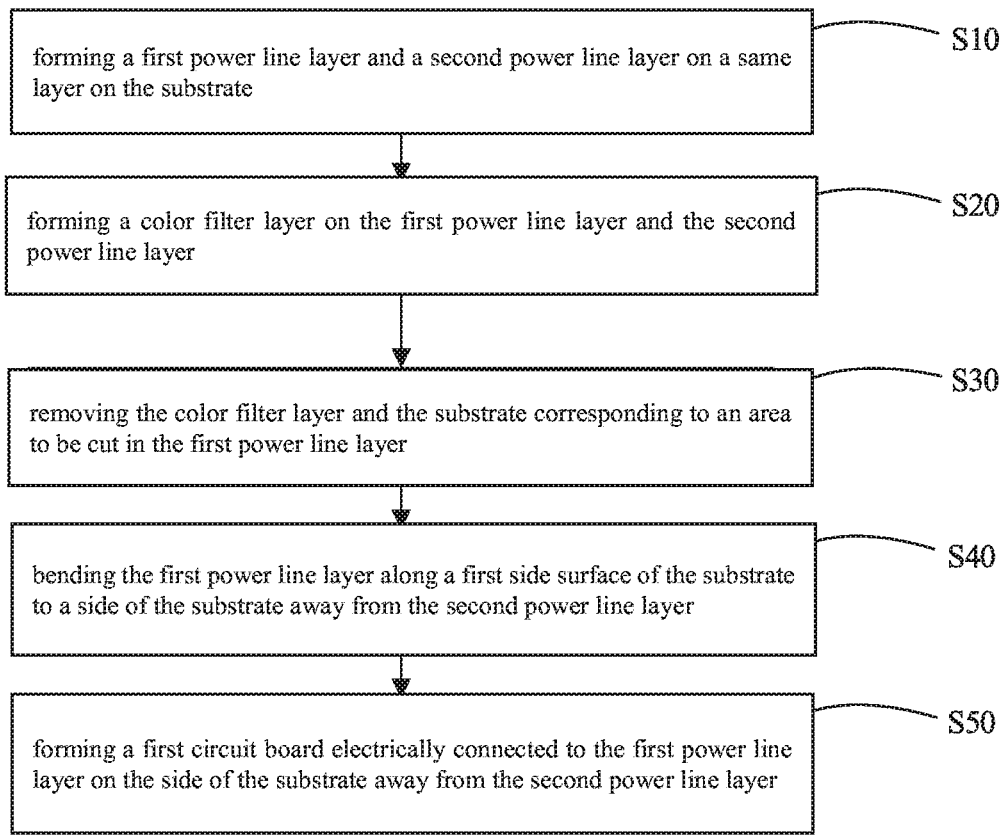
FIG. 8 is a step flowchart of a manufacturing method of a display panel of the present application.

Referring to FIG. 8, the present application provides a manufacturing method of a display panel 100, and the manufacturing method of the display panel comprises:

S10: forming a first power line layer 130 and a second power line layer 140 on a same layer on the substrate 110;

S20: forming a color filter layer 180 on the first power line layer 130 and the second power line layer 140;

S30: removing the color filter layer 180 and the substrate 110 corresponding to an area 170 to be cut in the first power line layer 130;

S40: bending the first power line layer 130 along a first side surface 111 of the substrate to a side of the substrate 110 away from the second power line layer 140; and S50: forming a first circuit board 150 electrically connected to the first power line layer 130 on the side of the substrate 110 away from the second power line layer 140.

In this application, a first power line layer electrically connected to a second power line layer is bent to backplate of a substrate to bound components such as controllers to the first power line layer of the backplate to achieve an extremely narrow lower bezel and increase a screen ratio of a screen, and enhance users' visual experience.

Technical solutions of the present application will now be described as follow with specific embodiments.

Embodiment 4

Please refer to FIG. 1 to FIG. 10, the manufacturing method of the display panel 100 comprises:

S10: forming a first power line layer 130 and a second power line layer 140 on a same layer on the substrate 110;

In this embodiment, the step S10 in the manufacturing method of the display panel 100 comprises:

S11: forming a plurality of second-type power lines in a second area on the substrate to form the second power line layer;

S12: forming a first flexible layer on the substrate not covered by the second area; and S13: forming a plurality of first-type power lines electrically connected to the second-type power lines on the first flexible layer to form the first power line comprising the first flexible layer and the first-type power lines layer.

Alternatively, the step S10 in the manufacturing method of the display panel 100 comprises:

S11: forming a plurality of second-type power lines in the second area on the substrate to form the second power line layer;

S12: forming a first flexible layer on the substrate, wherein the first flexible layer bonds on the second-type power supply lines; and S13: forming a plurality of first-type power lines electrically connected to the second-type power lines on the first flexible layer to form the first power line layer comprising the first flexible layer and the first-type power lines.

Alternatively, the step S10 in the manufacturing method of the display panel 100 comprises:

S11: forming a first flexible layer on the first area on the substrate;

S12: forming a plurality of second-type power lines on the substrate, wherein the plurality of second-type power lines bonds on the first flexible layer to form a second power line layer; and S13: forming a plurality of first-type power lines bond on the second-type power lines and electrically connected to the second-type power lines on the first flexible layer to form the first type power line layer comprising the first flexible layer and the first power lines.

In this embodiment, the first area comprises a non-display area of the display panel 100.

In this embodiment, the second area comprises a display area of the display panel 100.

After the Step S10, the manufacturing method of the display panel 100 further comprises:

S101: forming a protection layer 160 on the first-type power line S132; and

In this embodiment, the first end 161 of the protection layer 160 is located on the first portion 134 of the first-type power line 132 close to the second power line layer 140. The second end 162 is located on the second portion 135 of the first type power line 132 away from the second power line layer 140, please refer to FIG. 9 for further details. The first protection layer 160 mainly plays a role of isolating moisture and oxygen from the curved portion 133 of the first type power line 132 that is located on the first side surface 111 to ensure the first power line layer 130 works normally.

Figure 9:
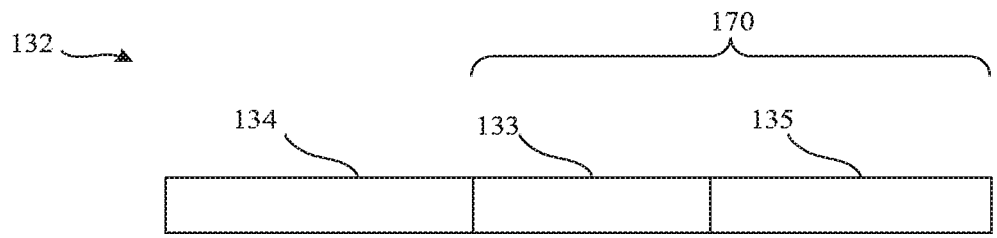
FIG. 9 is a process flowchart of a manufacturing method of a display panel of the present application.

In this embodiment, the first end 161 of the protection layer 160 covers the first portion 134 of the first type power line 132 and overlaps the second power line layer 140, please refer to FIG. 9 for further details. The first protection layer 160 is bonded on the second power line layer 140 to better protect the first type power line 132 from moisture, oxygen, etc., and to ensure that the first power line layer 130 works normally In this embodiment, the protection layer 160 is made of a flexible material.

In this embodiment, after the step S10, the manufacturing method of the display panel 100 comprises:

S102: forming a sealing layer on the first power line layer 130 and the second power line layer 140. By forming the sealing layer, the display panel 100 is sealed from moisture and oxygen, which effectively protects the normal operation of the display panel.

Figure 10:
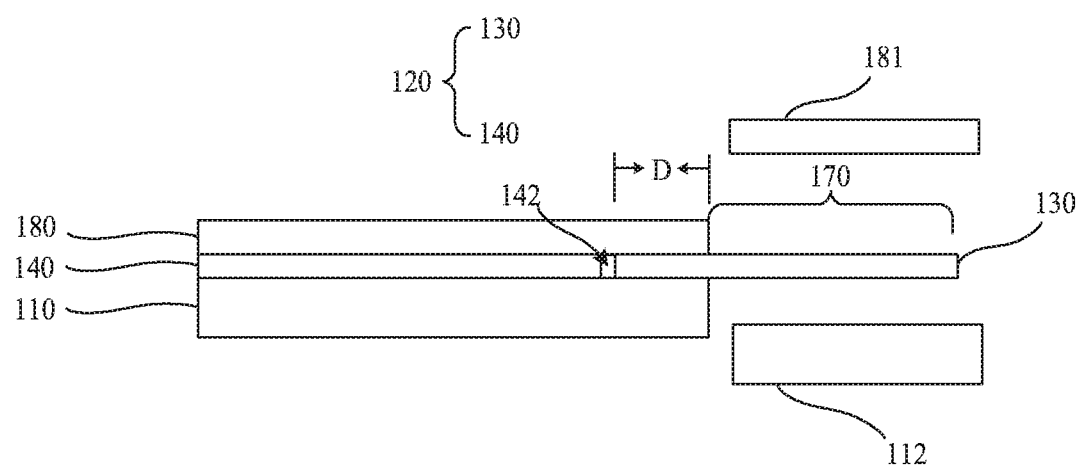
FIG. 10 is a process flowchart of a manufacturing method of a display panel of the present application.

In this embodiment, the step after forming the second-type power cord further comprises:

forming terminals corresponding to the second type power line on the side of the second type power line close to the first power line layer 130 to form a terminal area 142 of the second power line layer 140, see FIG. 10 for further details.

In this embodiment, the horizontal distance between the terminal area 142 of the second power line layer 140 and the area to be cut 170 in the first power line layer 130 is 300 µm to 500 µm. There is a pitch left between the terminal area 142 of the second power line layer 140 and the first side surface 111, so that the first power line layer 130 can be better arranged to make the first-type power line 132 being electrically connected to the terminal area 142 of the second power cord layer 140. Please refer to FIG. 10 for further details.

In this embodiment, the horizontal distance between the terminal area 142 of the second power line layer 140 and the area 170 to be cut in the first power line layer 130 is 300 µm. The color filter layer 180 and the substrate 110 corresponding to the area 170 to be cut in the first power line layer 130 are removed, and the first power line layer 130 is bent along the first side surface 111 of the substrate to the side of the substrate 110 away from the second power line layer 140 to realize a narrower bezel of the display panel, please refer to FIG. 10 for further details.

In this embodiment, the horizontal distance between the terminal area 142 of the second power line layer 140 and the area 170 to be cut in the first power line layer 130 is 500 μm. Although the bezel of the display panel is wider, the first type power line 132 of the first power line layer 130 and the terminal area 142 of the second power line layer 140 are more firmly and electrically connected, please refer to the FIG. 10 for further details.

In this embodiment, the horizontal distance between the terminal area 142 of the second power line layer 140 and the area 170 to be cut in the first power line layer 130 is 400 μm. It not only ensures a narrow bezel of the display panel, but also ensures a stable electrical connection between the first type power line 132 of the first power line layer 130 and the terminal area 142 of the second power line layer 140. See FIG. 10 for further details.

In this embodiment, the horizontal distance between the terminal area 142 of the second power line layer 140 and the area to be cut 170 in the first power line layer 130 is less than 100 microns. By shortening the horizontal distance, at the step S30, the color filter layer 180 and the substrate 110 corresponding to the area 170 to be cut in the first power line layer 130 are removed, and the first power line layer 130 is bent along the first side surface 111 of the substrate to the side of the substrate 110 away from the second power line layer 140 to realize a very narrow bezel of the display panel, please refer to FIG. 10 for further details.

In this embodiment, the horizontal distance between the terminal area 142 of the second power line layer 140 and the area 170 to be cut in the first power line layer 130 is 0. By shortening the horizontal pitch to zero, at the step S30, the color filter layer 180 and the substrate 110 corresponding to the first power line layer 130 not in contact with the second power line layer 140 are removed Then, the first power line layer 130 is directly bent to the side of the substrate 110 away from the second power line layer 140 to achieve an extremely narrow bezel of the display panel. Please refer to FIG. 6 for further details, In this embodiment, the first-type power line 132 can be a fan-out trace or a metal line, used for circuit conduction and signal transmission.

In this embodiment, the second-type of power line can be a signal line, a scanning line, or a metal line in the array substrate, used for circuit conduction and signal transmission.

In this embodiment, the substrate 110 can be an array substrate or a substrate.

In this embodiment, the substrate 110 and the power line layer 120 form an array substrate.

S20: forming a color filter layer 180 on the first power line layer 130 and the second power line layer 140.

S30: removing the color filter layer 180 and the substrate 110 corresponding to an area 170 to be cut in the first power line layer 130.

In this embodiment, the removed color filter layer 180 is a color filter layer removal portion 181, and the removed substrate 110 is a substrate removal portion 112, please refer to FIG. 10 for grater details.

In this embodiment, when there is step S102, the step S30 further comprises:

S31: remove the sealing layer corresponding to the area 170 to be cut in the first power line layer 130.

In this embodiment, the horizontal distance between the terminal area 142 of the second power line layer 140 and the area 170 to be cut in the first power line layer 130 is determined according to actual conditions, and will not be related to removal of the color filter layer 180 corresponding to the first power line layer 130 contacted by the line layer 140 and the substrate 110 to form the display panel 100 comprising the display area 101 and the non-display area 102 located at the periphery of the display area 101.

Horizontal distances d between any two first borders 1011 of the display area 101 and a second borders 103 of the display panel 100 corresponding thereto are the same. One of the horizontal distances d1 is equal to a length of the other horizontal distance d2, please refer to FIG. 7 for further details. The four narrow bezels at the upper, lower, left, and right of the display panel and the length of the bezel gaps at the upper, lower, left, and right of the display panel are equal.

S40: bending the first power line layer 130 along the first side surface 111 of the substrate 110 to a side of the substrate 110 away from the second power line layer 140. Please refer to FIG. 5 for further details.

S50: forming a first circuit board 150 electrically connected to the first power line layer 130 on the side of the substrate 110 away from the second power line layer 140. Please refer to FIG. 5 for details.

In this embodiment, the first side surface 111 is a side surface of the substrate 110 close to the area 170 to be cut in the first power line layer 130.

In this embodiment, the first circuit board 150 comprises a flip-chip film, a printed circuit board, or a combination of both the flip-chip film and the printed circuit board.

In this embodiment, by electrically connecting the first power line layer and the second power line layer, the substrate and the color filter layer corresponding to the area 170 to be cut of the first power line layer are removed, and the first power line layer is bent to the substrate away from the side of the second power line layer. The first power line layer is electrically connected to the first circuit board on the side of the substrate far from the second power line layer, which realizes the normal display effect of the display surface and greatly reduces the bezels of the display panel, increases the screen ratio of the display panel, and improves the users' visual experience.

The present application also proposes a display device comprising the above-mentioned display panel, and a working principle of the display device is the same as or similar to the above-mentioned display panel, and will not be repeated here.

The present application discloses a display panel and a manufacturing method thereof. The display panel comprises a substrate and a power line layer on the substrate. The power line layer includes a first power line layer and a second power line layer. The second power line layer is electrically connected to the first power line layer, and the first power line layer extends toward the first side of the substrate, and is bent along the first side until the substrate is away from a side of the second power line layer. A first circuit board is disposed on a side of the substrate away from the second power line layer, and the first circuit board is electrically connected to the first power line layer. In this application, the first power line layer electrically connected to the second power line layer is bent to the backplate of the substrate, and the controller and other components are bound to the first power line layer of the backplate to achieve an extremely narrow lower bezel, increase the screen ratio of the screen, and improve users' visual experience.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A manufacturing method of a display panel, comprising:
   forming a first power line layer and a second power line layer on a same layer on a substrate;
   forming a color filter layer on the first power line layer and the second power line layer;
   removing the color filter layer and the substrate corresponding to an area to be cut in the first power line layer;
   bending the first power line layer along a first side surface of the substrate to a side of the substrate away from the second power line layer; and
   forming a first circuit board electrically connected to the first power line layer on the side of the substrate away from the second power line layer.

2. The method according to claim 1, wherein:
   the step of forming the first power line layer and the second power line layer comprising:
   forming a plurality of second-type power lines in a second area on the substrate to form the second power line layer;
   forming a first flexible layer on the substrate not covered by the second area;
   forming a plurality of first-type power lines electrically connected to the second-type power lines on the first flexible layer to form the first power line comprising the first flexible layer and the first-type power lines layer; or
   the step of forming the first power line layer and the second power line layer comprises:
   forming a plurality of second-type power lines in the second area on the substrate to form the second power line layer;
   forming a first flexible layer on the substrate, wherein the first flexible layer bonds on the second-type power supply lines;
   forming a plurality of first-type power lines electrically connected to the second-type power lines on the first flexible layer to form the first power line layer comprising the first flexible layer and the first-type power lines; or
   the step of forming the first power line layer and the second power line layer comprises:
   forming a first flexible layer on the first area on the substrate;
   forming a plurality of second-type power lines on the substrate, wherein the plurality of second-type power lines bonds on the first flexible layer to form a second power line layer;
   forming a plurality of first-type power lines bond on the second-type power lines and electrically connected to the second-type power lines on the first flexible layer to form the first type power line layer comprising the first flexible layer and the first power lines.

3. The method of claim 1, wherein after the step of forming the first power line layer and the second power line layer, the method further comprises:
   forming a protection layer on the first-type power line; and
   forming a sealing layer on the first power line layer and the second power line layer.

4. The method of claim 1, wherein the display panel comprises a display area and a non-display area located at the periphery of the display area; and
   horizontal distances between any two first borders of the display area and a second borders of the display panel corresponding thereto are the same.

* * * * *